US009023683B2

(12) United States Patent
Nishimura et al.

(10) Patent No.: US 9,023,683 B2
(45) Date of Patent: May 5, 2015

(54) ORGANIC SEMICONDUCTOR TRANSISTOR WITH EPOXY-BASED ORGANIC RESIN PLANARIZATION LAYER

(71) Applicant: Sharp Laboratories of America, Inc., Camas, WA (US)

(72) Inventors: Karen Nishimura, Washougal, WA (US); Lisa Stecker, Vancouver, WA (US); Themistokles Afentakis, Camas, WA (US); Kurt Ulmer, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 13/893,110

(22) Filed: May 13, 2013

(65) Prior Publication Data

US 2014/0332760 A1 Nov. 13, 2014

(51) Int. Cl.
 *H01L 51/40* (2006.01)
 *H01L 51/05* (2006.01)
 *H01L 51/00* (2006.01)

(52) U.S. Cl.
 CPC ........ *H01L 51/0545* (2013.01); *H01L 51/0018* (2013.01)

(58) Field of Classification Search
 None
 See application file for complete search history.

(56) References Cited

U.S. PATENT DOCUMENTS

| 2007/0196962 A1* | 8/2007 | Morisue et al. | 438/149 |
| 2011/0180907 A1* | 7/2011 | McConnell | 257/618 |
| 2011/0237010 A1* | 9/2011 | Lee et al. | 438/34 |
| 2012/0146143 A1* | 6/2012 | Kang et al. | 257/347 |
| 2012/0153285 A1* | 6/2012 | James et al. | 257/57 |

FOREIGN PATENT DOCUMENTS

| JP | 2010034342 | | 2/2010 | |
| JP | 2010140980 | | 6/2010 | |
| JP | 2010186768 | | 8/2010 | |
| WO | WO 2011/139774 | * | 4/2010 | ............. H01L 51/00 |
| WO | WO 2011/139774 | * | 11/2011 | ............. H01L 51/50 |

* cited by examiner

*Primary Examiner* — Wensing Kuo
*Assistant Examiner* — Herve Assouman
(74) *Attorney, Agent, or Firm* — Law Office of Gerald Maliszewski; Gerald Maliszewski

(57) ABSTRACT

A method is provided for forming an epoxy-based planarization layer overlying an organic semiconductor (OSC) film. Generally, the method forms a fluoropolymer passivation layer overlying the OSC layer. A photopatternable adhesion layer is formed overlying the fluoropolymer passivation layer, and patterned. A photopatternable planarization layer, comprising an epoxy-based organic resin, is formed overlying the photopatternable adhesion layer and patterned to expose the fluoropolymer passivation layer. Then, the fluoropolymer passivation layer is plasma etched to expose the OSC layer. More explicitly, the method can be used to fabricate a bottom gate or top gate organic thin-film transistor (OTFT). Top gate and bottom gate OTFT devices are also provided.

10 Claims, 7 Drawing Sheets

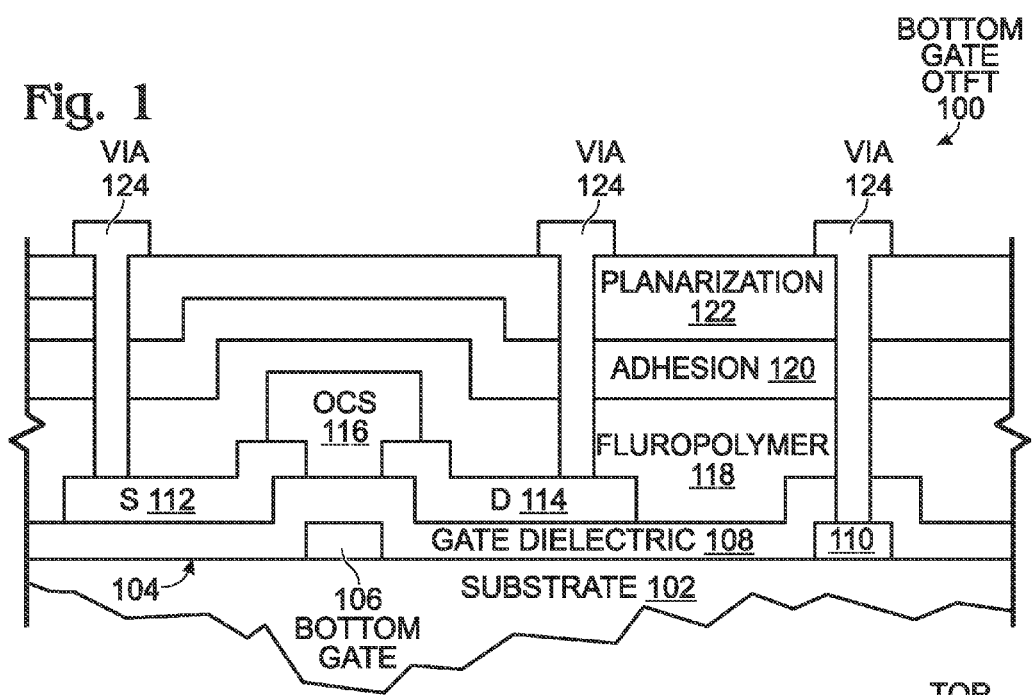
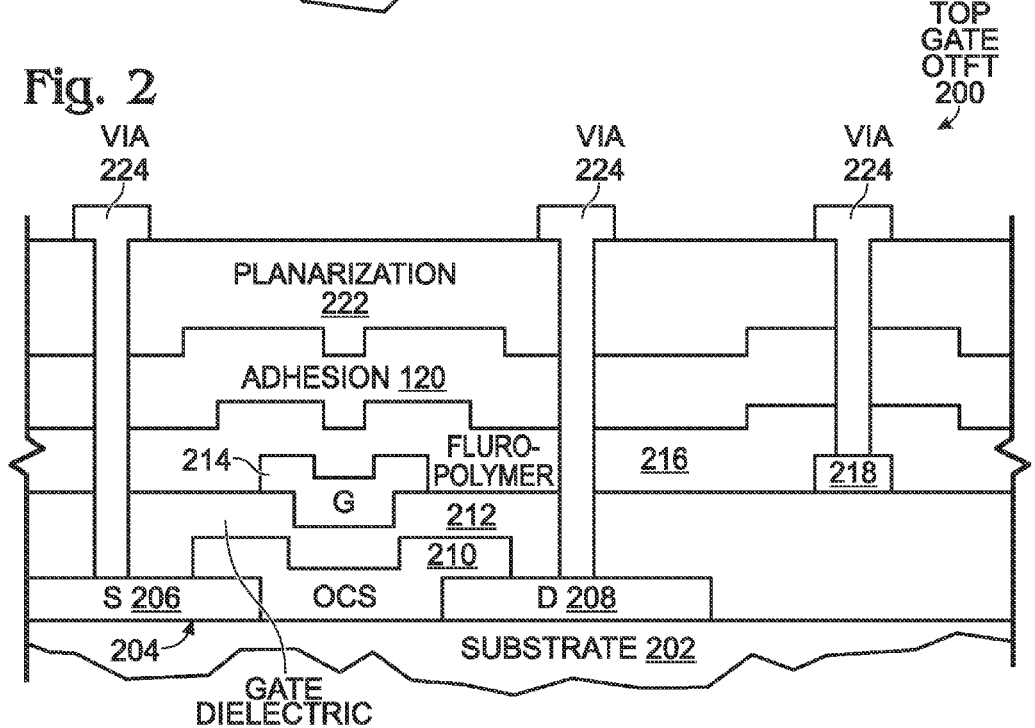

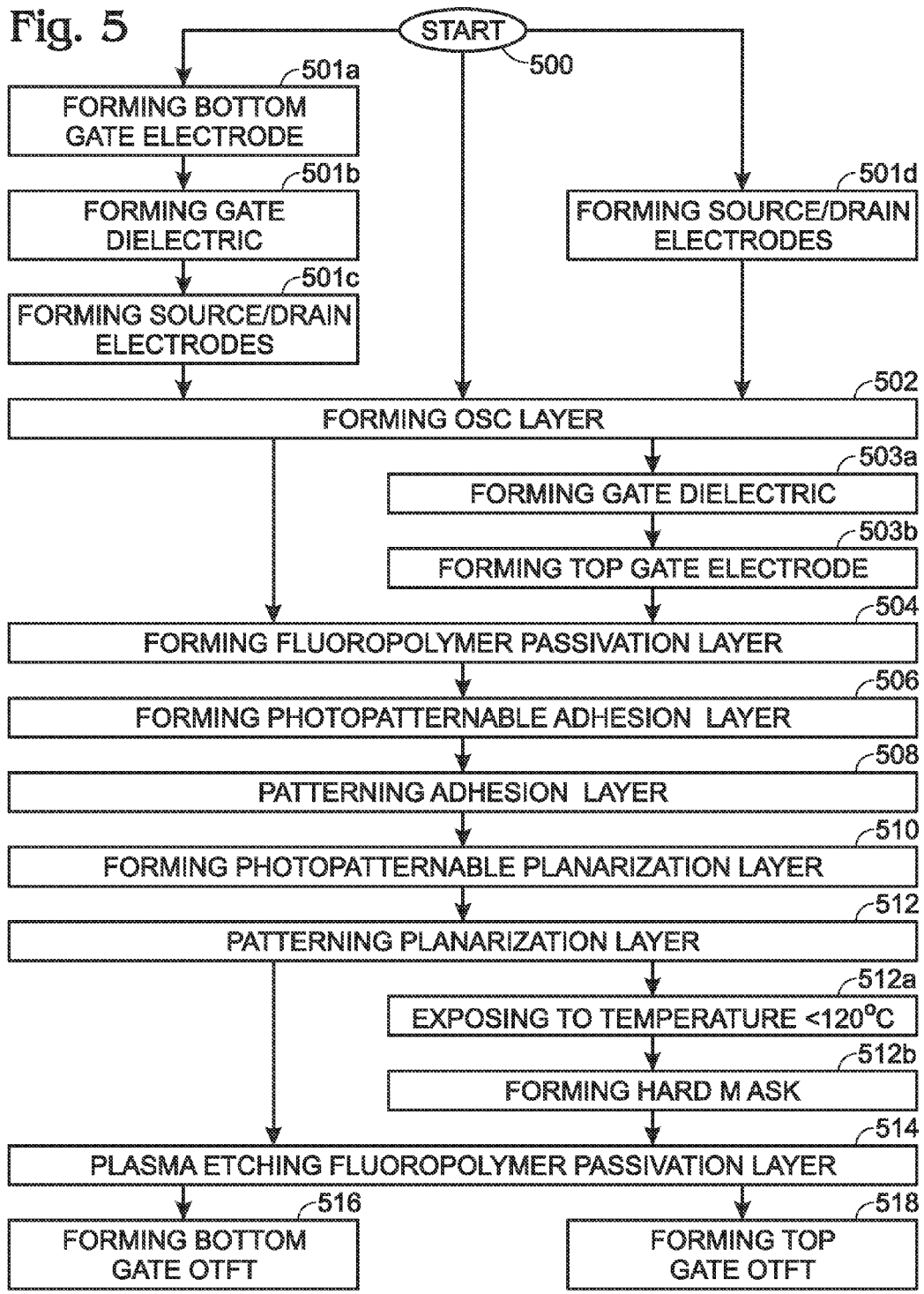

US 9,023,683 B2

ORGANIC SEMICONDUCTOR TRANSISTOR WITH EPOXY-BASED ORGANIC RESIN PLANARIZATION LAYER

BACKGROUND OF THE INVENTION

1. Field of the Invention

This invention generally relates to integrated circuit (IC) fabrication and, more particularly, to the use of photopatternable planarization materials, and associated solvents, in the fabrication, of devices made with organic semiconductor (OSC) films.

2. Description of the Related Art

Organic field-effect transistors (OFETs) and integrated circuits can be prepared by means of mass-printing or thin film deposition methods. The selection of print methods for the different layers is determined by dimensional requirements and the properties of printed materials, as well as economic and technical considerations of the final printed products. Optimal resolution of these considerations typically results in a combination of several print methods for the fabrications of the devices, as opposed to a single method.

An OFET is a transistor that uses an organic semiconductor (OSC) in its channel. OTFTs are a type of OFET. OTFTs can be prepared either by vacuum evaporation of small molecules, by solution-casting of polymers or small molecules, or by mechanical transfer of a peeled single-crystalline organic layer onto a substrate. These devices have been developed to realize low-cost, large-area electronic products. OTFTs have been fabricated with various device geometries.

Organic polymers, such as poly(methyl-methacrylate) (PMMA), CYTOP, PVA, polystyrene, parylene, etc., can be used as a dielectric. OFETs employing numerous aromatic and conjugated materials as the active semiconducting layer have been reported, including small molecules such as rubrene, tetracene, pentacene, diindenoperylene, perylenediimides, tetracyanoquinodimethane (TCNQ), and polymers such as polythiophenes (especially poly 3-hexylthiophene (P3HT)), polyfluorene, polydiacetylene, poly 2,5-thienylene vinylene, poly p-phenylene vinylene (PPV). These can be deposited via vacuum or solution base methods, the latter being of interest for printed electronics. The newer generation of solution processable organic semiconductors consists of blends of high performance small molecule and polymeric molecules for optimum performance and uniformity.

As part of a typical IC fabrication process, each level of the IC is finished with a planarization layer that acts as a foundation for an overlying IC level. Ideally, this planarization layer can be patterned using photolithographic processes to form vias that make electrical interconnections between levels. In short, photolithography uses light to transfer a geometric pattern from a photomask to a light-sensitive material. A series of chemical treatments then either engraves the exposure pattern into, or enables deposition of a new material in the desired pattern upon, the material underneath the light-sensitive material. The photolithography process can create extremely small patterns (e.g. nanometers in size), and it affords exact control over the shape and size of the objects it creates because it can create patterns over an entire surface cost-effectively.

Conventional photolithography processes may use a wet chemical treatment, e.g. the so-called RCA clean procedure based on solutions containing hydrogen peroxide, to remove organic or inorganic contaminations. Obviously, this can be an issue when working with organic semiconductors. Further, heat may be used to drive off any accumulated moisture, which may affect film adhesion. After exposure to light a developer is applied and a post-bake performed. The use of developer solvents can be detrimental to OSC films. Further, it is known that OSC be materials can be damaged at temperatures greater than 120° C. Most commercially available photopatternable planarization materials are polyimides with relatively high cure temperatures of greater than 200° C. Fluoropolymer is known to be an effective passivation material to protect OSC film from solvents. However, additional problems exist in creating adhesion between a fluoropolymer passivation layer and an overlying photopatternable planarization layer.

It would be advantageous if a photopatternable planarization layer could be used in the fabrication of OSC transistors.

It would be advantageous if the above-mentioned photopatternable planarization layer could be used in conjunction with a fluoropolymer passivation material.

SUMMARY OF THE INVENTION

Disclosed herein is a method of incorporating a low-temperature (e.g., less than 120° C.), patternable, planarization material into the fabrication process for an organic thin film transistor (OTFT) array. Most commercially available photopatternable planarization materials are polyimides with relatively high cure temperatures (e.g., greater than 200° C.). However, the OTFT process presented here can be performed at less than 120° C., to avoid damaging the organic semiconductor (OSC) material. The fabrication process described herein utilizes a chemically amplified, epoxy based, photoresist as the planarization material. It also addresses compatibility issues between the planarization layer and underlying organic materials utilized in the OTFT fabrication.

Accordingly, a method is provided for forming an epoxy-based planarization layer overlying an OSC film. Generally, the method forms a fluoropolymer passivation layer overlying the OSC layer. A photopatternable adhesion layer is formed overlying the fluoropolymer passivation layer and patterned. A photopatternable planarization layer, comprising an epoxy-based organic resin, is formed overlying the photopatternable adhesion layer and patterned to expose the fluoropolymer passivation layer. Then, the fluoropolymer passivation layer is plasma etched to expose the OSC layer.

More explicitly, the method can be used to fabricate a bottom gate transistor. In that case, a bottom gate electrode is formed overlying a substrate top surface prior to forming the OSC layer. A gate dielectric is formed overlying the bottom gate electrode and exposed regions of the substrate top surface adjacent to the bottom gate electrode. Source and drain electrodes are formed overlying the gate dielectric, adjacent to a first area of the bottom gate electrode. An OSC channel is formed on the gate dielectric overlying the first area of the bottom gate electrode. Thus, plasma etching the fluoropolymer passivation layer includes exposing the source electrode and the drain electrode, and a second area of the bottom gate electrode. As a result, a bottom gate OTFT is fabricated.

The bottom gate OTFT is provided having a bottom gate electrode overlying the substrate top surface. A gate dielectric overlies a first area of the bottom gate electrode and exposed regions of the substrate top surface adjacent to the bottom gate electrode. The gate dielectric is patterned to expose a second area of the bottom gate electrode. Source and drain electrodes overlie the gate dielectric, adjacent to the first area of the bottom gate electrode. An OSC channel on the gate dielectric overlies the first area of the bottom gate electrode, and a fluoropolymer passivation layer overlies the OSC channel, the source electrode, and the drain electrode. The fluoropolymer passivation layer is patterned to expose a region of the source electrode, a region of the drain electrode, and the second area of the bottom gate electrode. A photopatternable adhesion layer overlies the fluoropolymer passivation layer, and is patterned to expose the region of the source electrode, the region of the drain electrode, and the second area of the bottom gate electrode. A photopatternable planarization layer, comprising an epoxy-based organic resin, overlies the photopatternable adhesion layer, and is patterned to expose the region of the source electrode, the region of the drain electrode, and the second area of the bottom gate electrode. Metal-filled vias are connected to the region of the source electrode, the region of the drain electrode, and the second area of the bottom gate electrode.

Additional details of the above-described method and bottom gate device, a top gate transistor fabrication method, and a top gate transistor are presented below.

BRIEF DESCRIPTION OF THE DRAWINGS

FIG. 1 is a partial cross-sectional view of a bottom gate organic thin-film transistor (OTFT).

FIG. 2 is a partial cross-sectional view depicting a top gate OTFT.

FIG. 5 is a flowchart illustrating a method for forming an epoxy-based planarization layer overlying OSC film.

DETAILED DESCRIPTION

Figure 3A:
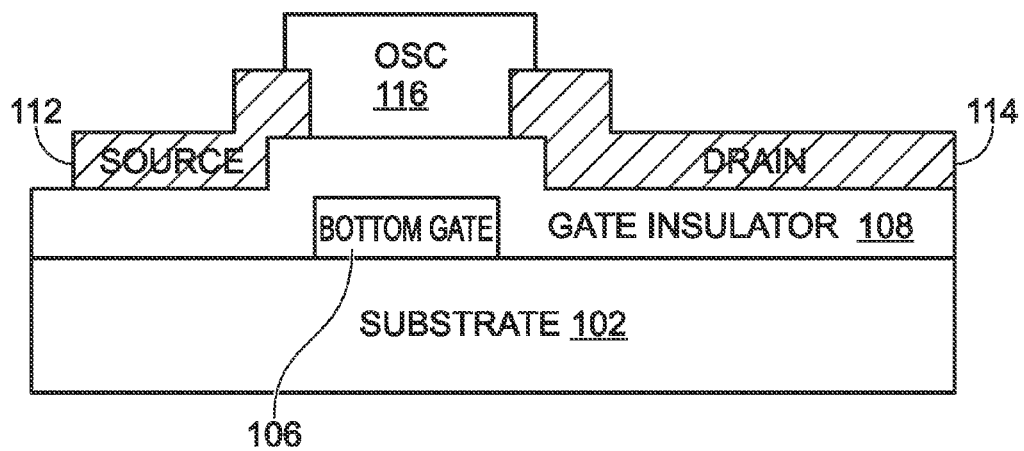
FIGS. 3A through 3E depict steps in the fabrication of a bottom gate OTFT device.

FIG. 1 is a partial cross-sectional view of a bottom gate organic thin-film transistor (OTFT). The bottom gate OTFT 100 comprises a substrate 102 with a top surface 104. The substrate 102 may be an insulator for example, such as glass. If the substrate is conductive, such as a semiconductor material for example, an insulating film (not shown) would overlie the substrate. A bottom gate electrode 106 overlies the substrate top surface 104. A gate dielectric 108 overlies a first area of the bottom gate electrode (shown as 106) and exposed regions of the substrate top surface adjacent to the bottom gate electrode, as shown. The gate dielectric 108 is patterned to expose a second area of the bottom gate electrode (not shown). Shown is a second area 110 of an adjacent bottom gate transistor. In one aspect, the gate dielectric 108 is an organic gate dielectric material such as poly(methy methacrylate) (PMMA), poly(styrene), poly(vinyl phenol), silsequioxane (glass resin), or benzocyclobutene (BCB).

A source electrode 112 (S) and a drain electrode 114 (D) overlie the gate dielectric 108, adjacent to the first area 106 of the bottom gate electrode. An organic semiconductor (OSC) channel 116 on the gate dielectric 108 overlies the first area 106 of the bottom gate electrode. The OSC channel 116 may be a material such as pentacene, tetraceno[2,3-b]thiophene, TIPS-pentacene, a-sexithiophene, oligothiophene-fluorine derivatives, regioregular(poly3-hexylthiophene), poly(3,3'''-didodecylquaterthiophene), or poly(2,5-bis(3-decylthiophen-2-yl)thieno[3,2-b]thiophene. The bottom gate electrode 106, source electrode 112, and drain electrode 114 may be a material such as a doped semiconductor, gold (Au), silver (Ag), platinum (Pt), aluminum (Al), copper (Cu), or combinations of the above-listed materials. The bottom gate electrode 106 need not be made of the same materials as the source electrode 112 and drain electrode 114.

A fluoropolymer passivation layer 118 overlies the OSC channel 116, the source electrode 112, and the drain electrode 114. The fluoropolymer passivation layer 118 is patterned to expose a region of the source electrode 112 (as shown), a region of the drain electrode 114 (as shown), and the second area of the bottom gate electrode (not shown). However, shown is the fluoropolymer passivation layer 118 patterned to expose the second area 110 of the adjacent transistor. One example of a fluoropolymer passivation material is Lisicon® P006, manufactured by Merck.

A photopatternable adhesion layer 120 overlies the fluoropolymer passivation layer 118, and is patterned to expose the region of the source electrode 112, the region of the drain electrode 114, and the second area of the bottom gate electrode (not shown). Again, what is shown is photopatternable adhesion layer 120 patterned to expose the second area 110 of the adjacent bottom gate electrode. In one aspect, the photopatternable adhesion layer 120 is an ultraviolet (UV) cross-linkable polymer dielectric material. One example of a photopatternable adhesion layer material is Lisicon® D207, manufactured by Merck.

A photopatternable planarization layer 122, comprising an epoxy-based organic resin, overlies the photopatternable adhesion layer 120. The photopatternable planarization layer 122 is patterned to expose the region of the source electrode 112, the region of the drain electrode 114, and the second area of the bottom gate electrode (not shown). Again, what is shown is the photopatternable planarization layer 122 patterned to expose the second area 110 of the adjacent bottom gate electrode. One example of a photopatternable planarization material is SU-8, manufactured by MicroChem Corp. Metal-filled vias 124 are connected to the region of the source electrode 112, the region of the drain electrode 114, and the second area of the bottom gate electrode (not shown). Again, what is shown is a metal-filled via 124 connected to the second area 110 of the adjacent bottom gate electrode. Note: the figure is not drawn to scale.

FIG. 2 is a partial cross-sectional view depicting a top gate OTFT. The top gate OTFT 200 comprises a substrate 202 with a top surface 204. A source electrode 206 (S) and a drain electrode 208 (D) overlie the substrate top surface 204. An OSC channel layer 210 overlies the source electrode 206, the drain electrode 208, and a region of the substrate top surface 204 (as shown) between the source electrode 206 and the drain electrode 208. As with the bottom gate device described above, the OSC channel layer 210 may be a material such as pentacene, tetraceno[2,3-b]thiophene, TIPS-pentacene, a-sexithiophene, oligothiophene-fluorine derivatives, regioregular(poly-3-hexylthiophene), poly(3,3'''-didodecylquaterthiophene), or poly(2,5-bis(3-decylthiophen-2-yl)thieno[3,2-b]thiophene.

A fluoropolymer gate dielectric 212 overlies the OSC channel layer 210, and is patterned to expose a region of the source electrode 206 (as shown) and a region of the drain electrode 208 (as shown). A top gate electrode 214 (G) overlies the fluoropolymer gate dielectric 212, with a first area (shown as 214) located between the source electrode 206 and the drain electrode 208. The top gate electrode 214, source electrode 206, and drain electrode 208 made be made from a material such as doped semiconductor, Au, Ag, Pt, Al, Cu, and combinations of the above-listed materials. Again, the top gate electrode 214 need not be made of the same materials as the source electrode 206 and drain electrode 208.

A fluoropolymer passivation layer 216 overlies the top gate electrode 214, and is patterned to expose the region of the source electrode 206, the region of the drain electrode 208, and a second area of the top gate electrode (not shown). However, what is shown is the fluoropolymer passivation layer 216 patterned to expose the second area 218 of an adjacent top gate electrode. A photopatternable adhesion layer 220 overlies the fluoropolymer passivation layer 216, and is patterned to expose the region of the source electrode 206, the region of the drain electrode 208, and the second area of top gate electrode (not shown). Shown is the photopatternable adhesion layer 220 patterned to expose the second area 218 of the adjacent top gate electrode. In one aspect, the photopatternable adhesion layer 220 is a UV cross-linkable polymer dielectric material.

A photopatternable planarization layer 222, comprising an epoxy-based organic resin, overlies the photopatternable adhesion layer 220. The photopatternable planarization layer 222 is patterned to expose the region of the source electrode 206, the region of the drain electrode 208, and the second area of the top gate electrode (not shown). Shown is the photopatternable planarization layer 222 patterned to expose the second area 218 of the adjacent top gate electrode. Metal-filled vias 224 are connected to the region of the source electrode 206, the region of the drain electrode 208, and the second area of top gate electrode (not shown). Shown is a metal-filled via 224 connected to the second area 218 of the adjacent top gate electrode. Note: the figure is not drawn to scale.

The devices described above were devised to address the challenges of incorporating a low-temperature planarization material, while also protecting underlying OSC and other organic layers from chemical attack during the fabrication process of an OTFT array. Solvents that are known to attack OSC include many ketones such as heptanone and cyclopentanone.

The soft-bake, post-expose bake, and hard-bake temperatures of the photopatternable epoxy-based organic resin planarization material described herein are less than 120° C., making it compatible with organic TFT temperature processing constraints. The photopatternable planarization adhesion layer and fluoropolymer passivation layer constitute a bilayer structure to cover the OSC. The fluoropolymer passivation layer protects exposed OSC sidewall from attack by solvents used in forming the overlying photopatternable planarization and adhesion layers.

Since the adhesion of the photopatternable planarization material to untreated fluoropolymer is typically very poor, a photopatternable adhesion material is sandwiched between the fluoropolymer passivation layer and the photopatternable planarization layer. While the photopatternable planarization layer adheres quite well to the photopatternable adhesion layer before plasma etching, where the plasma etching is used to remove fluoropolymer material, the adhesion of photopatternable planarization layer to the underlying photopatternable adhesion layer after exposure to fluorocarbon etch plasma is very poor. Therefore, the fabrication method described herein applies the photopatternable planarization layer to the photopatternable adhesion layer prior to plasma etching the fluoropolymer passivation layer. Alternatively stated, the fluoropolymer passivation layer is plasma etched using the photopatternable planarization layer as a hard mask material.

To summarize, the fluoropolymer/adhesion bilayer is patterned as follows:

Coat the OSC with the fluoropolymer passivation layer;
Coat, expose, and develop the photopatternable adhesion layer;
Coat, expose, and develop the photopatternable planarization layer; and,
Dry-etch the fluoropolymer passivation layer in a fluorocarbon plasma, using the photopatternable planarization layer as a hard mask material.

FIGS. 3A through 3E depict steps in the fabrication of a bottom gate OTFT device. In FIG. 3A, a bottom gate material 106 (e.g., aluminum) is evaporated onto a substrate 102 (e.g., glass) and patterned by photolithography. The gate electrode material may also be directly patterned by printing, for example. An organic dielectric 108 is applied over the gate electrode 106 by means of spin coating, printing, or evaporation. Many organic dielectrics can be used including, but are not limited to, poly(methy methacrylate) (PMMA), poly(styrene), polyvinyl phenol), silsesquioxane (glass resin), benzocyclobutene (BCB), and other proprietary organic compounds.

Source 112 and drain 114 electrode material is applied on top of the gate dielectric 108. The source/drain material 112/114 can be any conductive material (such as Ag, Au, Pt or other material possessing the appropriate work function) that is deemed to make a suitable contact to the semiconductor materials that is to be used as the active area in the OTFT device. Alternatively, other metals, heavily-doped semiconductors, or conductive polymers could be utilized for the source/drain 112/114 if the surfaces are appropriately treated. The source/drain electrodes 112/114 may be patterned by printing or by photolithography, followed by liftoff or etch. The organic semiconductor material 116 is typically applied by spin coating. This produces a continuous highly uniform film of semiconductor material on the surface of the source/drain electrodes 112/114 and organic dielectric material 108. Organic semiconductor materials of interest for OTFTs include pentacene, tetraceno[2,3-b]thiophene, TIPS-pentacene, a-sexithiophene, oligothiophene-fluorene derivative, regioregular(poly3-hexylthiophene), poly(3,3'''-didodecylquaterthiophene), poly(2,5-bis(3-decylthiophen-2-yl) thieno[3,2-b]thiophene), and other proprietary organic materials. The OSC 116 can be patterned in various ways. One approach is to apply a protection layer and photopatternable hard mask, and then plasma etching the OSC 116. In this case, the protection layer and hard mask do not need to be removed. Alternatively, the OSC 116 can be patterned by masking with an appropriate photoresist, wet etching the OSC, and then stripping the photoresist.

Figure 3B:
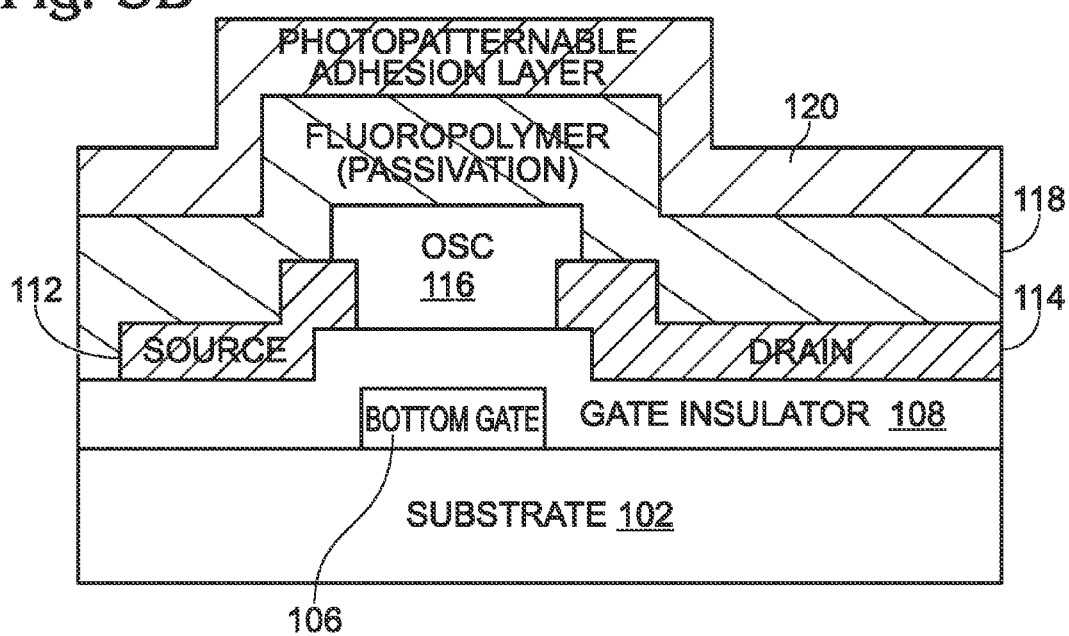
Figure 3C:
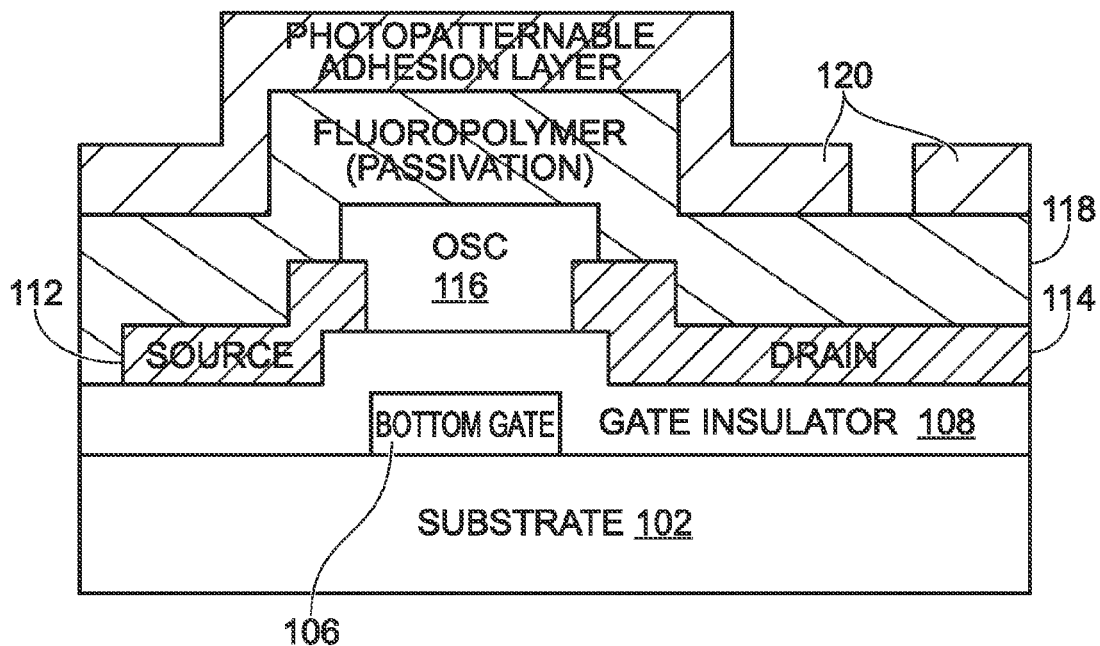
Figure 3D:
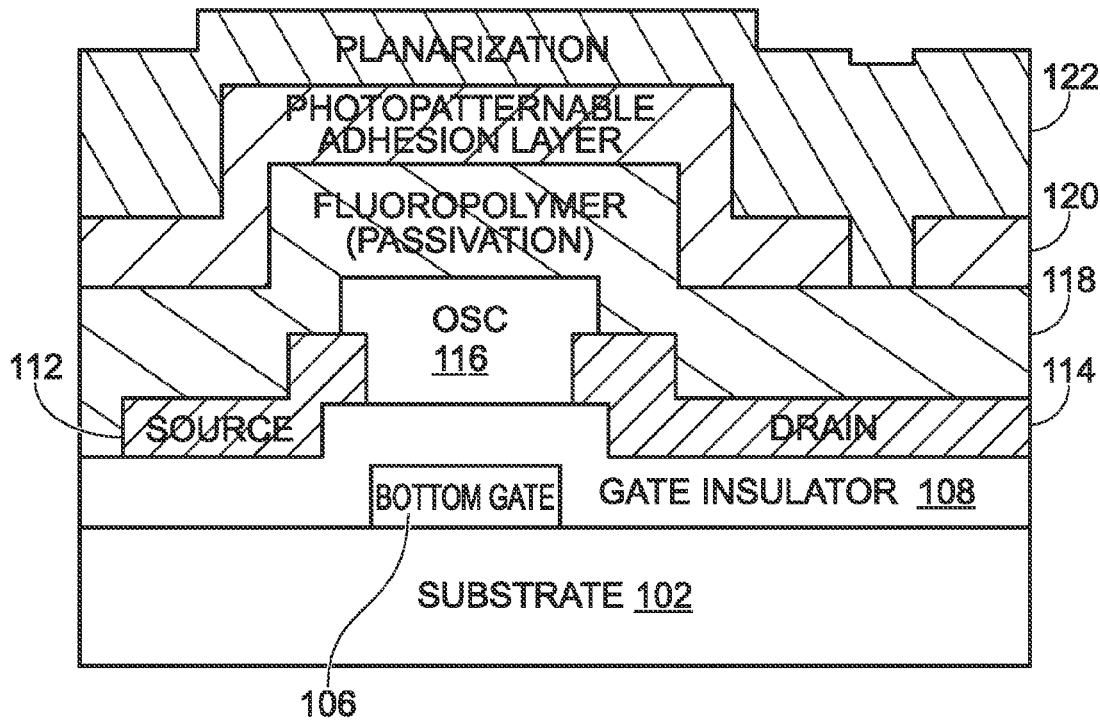
Figure 3E:
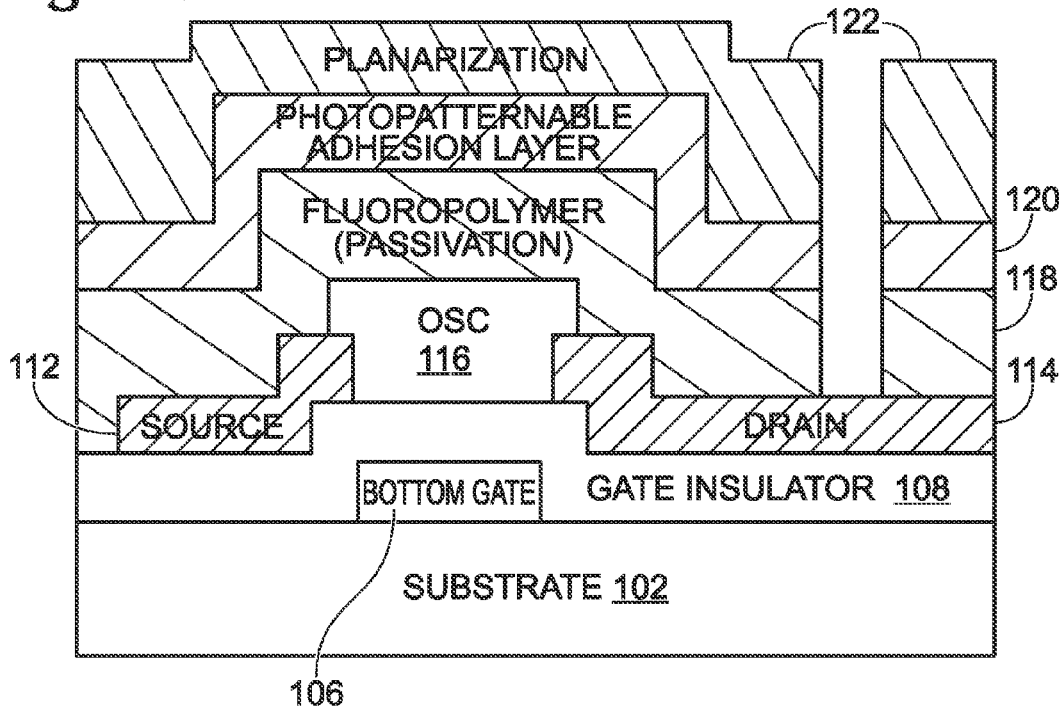

In FIG. 3B, after etching the OSC 116, a hi-layer of fluoropolymer passivation 118 and adhesion materials 120 are applied to the substrate. In FIG. 3C, openings in the adhesion layer 120 are photopatterned, and in FIG. 31) the photopatternable planarization layer 122 is spin-coated onto the substrate. The bilayer 118/120 protects the exposed USC sidewall 116 from attack by the photopatternable planarization layer solvents and developer and also provides a surface to which the photopatternable planarization layer can adhere. After the photopatternable planarization layer 122 is coated, exposed, and developed, the exposed fluoropolymer passivation layer 118 is dry-etched in a fluorocarbon plasma, thereby exposing the underlying source/drain regions 112/114 and allowing electrical contacts to be formed, see FIG. 3E.

Figure 4A:
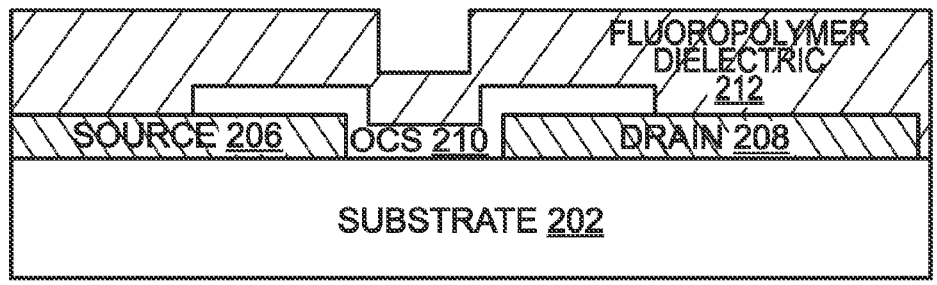
FIGS. 4A through 4G depict steps in the fabrication of a top gate OTFT.
Figure 4B:
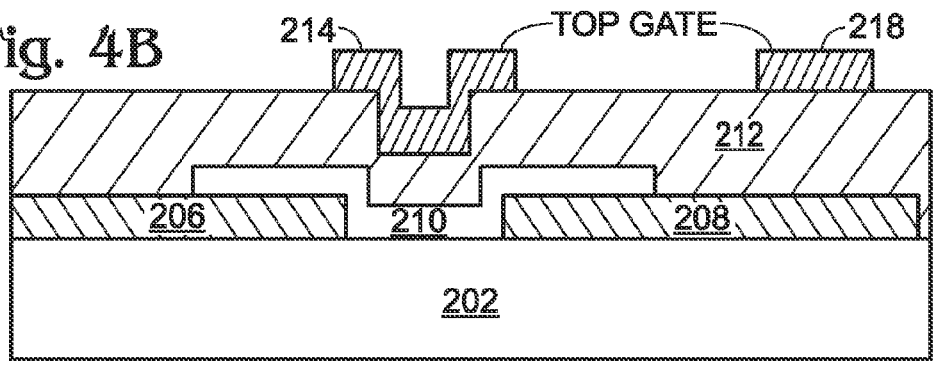
Figure 4C:
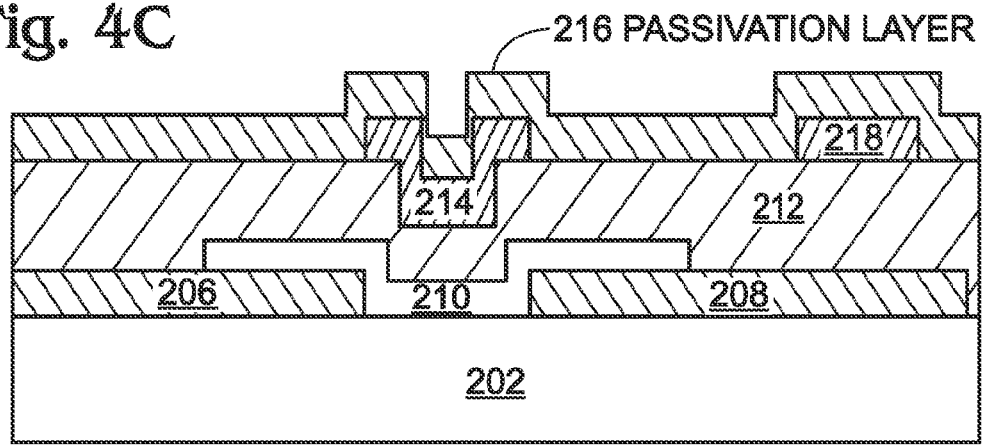
Figure 4D:
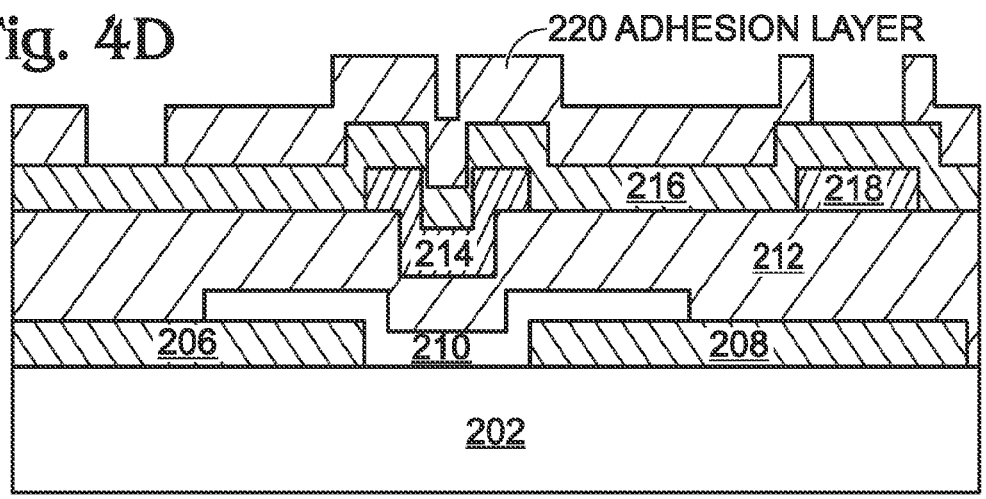
Figure 4E:
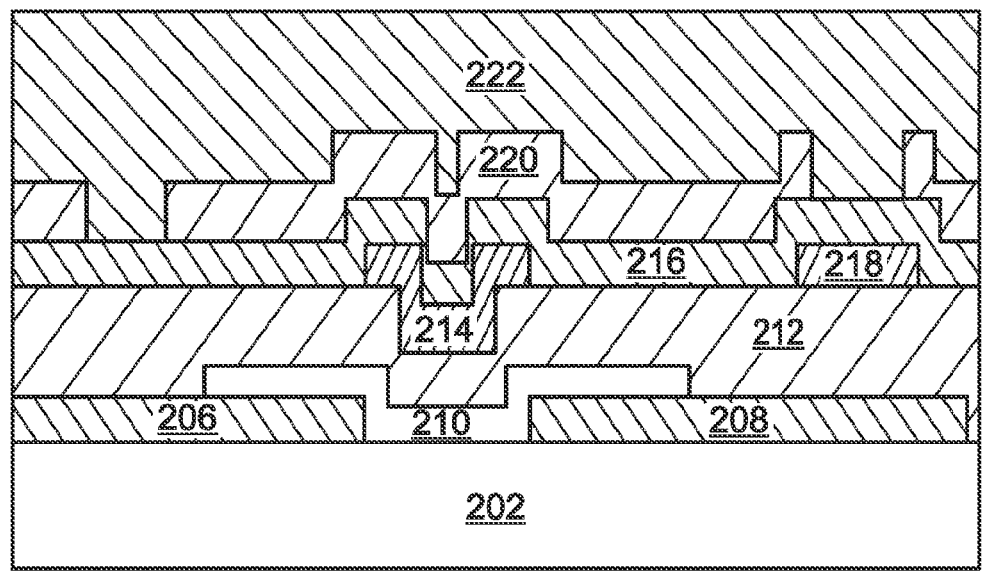
Figure 4F:
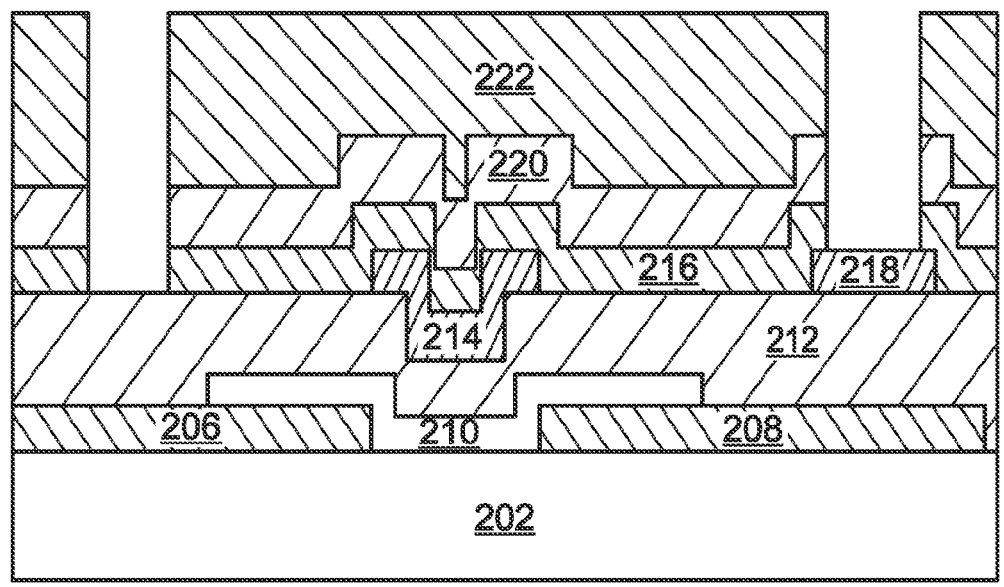
Figure 4G:
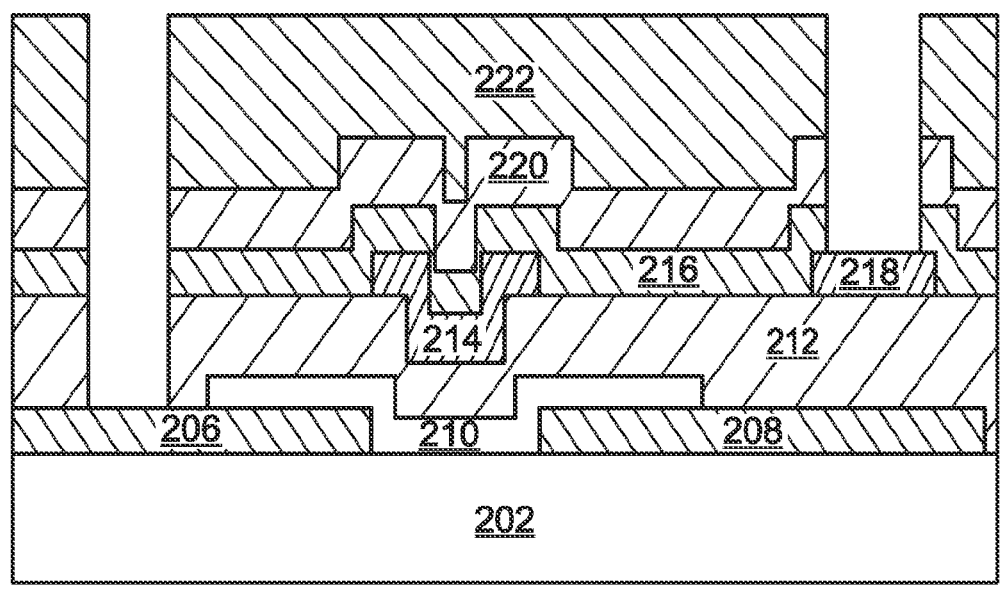

FIGS. 4A through 4G depict steps in the fabrication of a top gate OTFT. In FIG. 4A, material for the source and drain electrodes 206/208 is initially deposited and patterned. Alternatively, the source and drain electrodes 206/208 may be printed. An USC material is deposited and patterned to form channel 210. After patterning the OSC 210, a blanket coat of fluoropolymer dielectric material (top gate insulator 212) is applied over the USC 210. In FIG. 4B the top gate metal 214 and 218 is deposited and patterned. In FIG. 4C, a fluoropolymer passivation layer 216 applied over the entire structure, including the top gate 214 and the surrounding fluoropolymer gate dielectric 212. In FIG. 4D, an adhesion layer 220 is then applied and photopatterned. In FIG. 4E, the photopatternable planarization layer 222 is applied (e.g., by spin-coat). In FIG. 4F, the planarization layer 222 is photopatterned and the fluoropolymer passivation layer 216 is plasma-etched, revealing the top gate 218 and the regions of fluoropolymer gate dielectric 212 overlying the source/drain electrodes 206/208 to be etched. In FIG. 4G, the fluoropolymer gate dielectric layer 212 is plasma-etched in a fluorocarbon plasma using the photopatternable planarization layer as a hard mask.

FIG. 5 is a flowchart illustrating a method for forming an epoxy-based planarization layer overlying an OSC film. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 500.

Step 502 forms an OSC layer. For example, the OSC layer may be formed from a material such as pentacene, tetraceno [2,3-b]thiophene, TIPS-pentacene, a-sexithiophene, oligothiophene-fluorine derivatives, regioregular(poly3-hexylthiophene), poly(3,3'''-didodecylquaterthiophene), or poly(2,5-bis(3-decylthiophen-2-yl)thieno[3,2-b]thiophene. Step 504 forms a fluoropolymer passivation layer overlying the OSC layer. Step 506 forms a photopatternable adhesion layer overlying the fluoropolymer passivation layer. For example, the photopatternable adhesion layer may be a UV cross-linkable polymer dielectric material.

Step 508 patterns the photopatternable adhesion layer. Step 510 forms a photopatternable planarization layer, comprising an epoxy-based organic resin, overlying the photopatternable adhesion layer. Step 512 patterns the photopatternable planarization layer to expose the fluoropolymer passivation layer. In one aspect, Step 512 includes the following substeps. Step 512a exposes the photopatternable planarization layer to a temperature of less than 120 degrees C. Step 512h forms a photopatternable planarization layer hard mask in response to the temperature exposure. Step 514 plasma etches the fluoropolymer passivation layer to expose the OSC layer.

In one aspect, forming the photopatternable adhesion layer in Step 506 includes the photopatternable adhesion layer comprising a first solvent capable of reacting with the OSC layer. Forming the photopatternable planarization layer in Step 510 includes the photopatternable planarization layer comprising a second solvent capable of reacting with the OSC layer. Patterning the photopatternable adhesion layer (Step 508) and patterning the photopatternable passivation layer (Step 512) includes developing the photopatternable adhesion layer and photopatternable passivation layer with at least a third solvent capable of reacting with the OSC layer. Advantageously, in this aspect, the fluoropolymer passivation layer formed in Step 504 is impermeable to the first, second, and third solvents.

In one aspect, the method is used to fabricate a bottom gate OTFT, as follows. Prior to forming the OSC layer in Step 502, Step 501a forms a bottom gate electrode overlying a substrate top surface. Step 501b forms a gate dielectric overlying the bottom gate electrode and exposed regions of the substrate top surface adjacent to the bottom gate electrode. The gate dielectric may be an organic gate dielectric such as poly (methy methacrylate) (PMMA), poly(styrene), poly(vinyl phenol), silsequioxane (glass resin), or benzocyclobutene (BCB).

Step 501c forms a source electrode and a drain electrode overlying the gate dielectric, adjacent to a first area of the bottom gate electrode. Then, forming the OSC layer in Step 502 includes forming an OSC channel on the gate dielectric overlying the first area of the bottom gate electrode.

Patterning the photopatternable adhesion layer in Step 508 includes exposing regions of fluoropolymer passivation layer overlying the source electrode and drain electrode, and the second area of the bottom gate electrode. Patterning the photopatternable planarization layer in Step 512 includes exposing the regions of fluoropolymer passivation layer overlying the source electrode and drain electrode, and the second area of the bottom gate electrode. Plasma etching the fluoropolymer passivation layer in Step 514 includes plasma etching regions of the fluoropolymer passivation layer to expose the source electrode and the drain electrode, and a second area of the bottom gate electrode. Step 516 forms a completed bottom gate OTFT.

In another aspect, the method can be used to fabricate a top gate OTFT, as follows. Prior to forming the OSC layer in Step 502, Step 501d forms a source electrode and drain electrode overlying a substrate top surface. Then, Step 502 forms an OSC channel layer overlying the source electrode, the drain electrode, and a region of substrate top surface between the source electrode and the drain electrode. Step 503a forms a fluoropolymer gate dielectric overlying the OSC channel layer. Step 503b forms a top gate electrode overlying the fluoropolymer gate dielectric, with a first area located between the source electrode and the drain electrode. Forming the fluoropolymer passivation layer in Step 504 includes forming the fluoropolymer passivation layer overlying the top gate electrode and regions of the fluoropolymer gate dielectric that are exposed.

Patterning the photopatternable adhesion layer in Step 508 includes patterning the photopatternable adhesion layer to expose zones of the fluoropolymer passivation layer. More explicitly, Step 508 includes exposing zones of fluoropolymer passivation layer overlying the source electrode, drain electrode, and a second area of the top gate electrode. Patterning the photopatternable planarization layer in Step 512 includes patterning the photopatternable planarization layer to expose the zones of fluoropolymer passivation layer.

Plasma etching the fluoropolymer passivation layer in Step 514 includes plasma etching the zones of fluoropolymer passivation layer and regions of fluoropolymer gate dielectric. More explicitly. Step 514 includes plasma etching the fluoropolymer passivation layer and underlying fluoropolymer gate dielectric over the drain electrode and source electrode, and plasma etching the fluoropolymer passivation layer overlying the second area of the top gate electrode. Step 518 forms a completed top gate OTFT.

A top gate OTFT, bottom gate OTFT, and associated fabrication methods have been provided. Examples of particular materials and process sequences have been presented to illustrate the invention. However, the invention is not limited to merely these examples. Other variations and embodiments of the invention will occur to those skilled in the art.

We claim:

1. A method for forming an epoxy-based planarization layer overlying an organic semiconductor (OSC) film, the method comprising:
   forming a source electrode and drain electrode overlying a substrate top surface;
   forming an OSC channel layer overlying a region of substrate top surface between the source electrode and the drain electrode;
   forming a fluoropolymer gate dielectric overlying the OSC channel layer;

forming a top gate electrode overlying the fluoropolymer gate dielectric, with a first area located between the source electrode and the drain electrode;

forming a fluoropolymer passivation layer overlying the top gate electrode and regions of the fluoropolymer gate dielectric that are exposed;

forming a photopatternable adhesion layer overlying the fluoropolymer passivation layer;

patterning the photopatternable adhesion layer to expose zones of the fluoropolymer passivation layer;

forming a photopatternable planarization layer, comprising an epoxy-based organic resin, overlying the photopatternable adhesion layer;

patterning the photopatternable planarization layer to expose the zones of fluoropolymer passivation layer;

plasma etching the zones of fluoropolymer passivation layer and regions of fluoropolymer gate dielectric; and, forming a completed top gate OTFT.

2. The method of claim 1 wherein patterning the photopatternable adhesion layer to expose the zones of fluoropolymer passivation layer includes exposing zones of fluoropolymer passivation layer overlying the source electrode, drain electrode, and a second area of the top gate electrode; and, wherein plasma etching the zones of fluoropolymer passivation layer and regions of fluoropolymer gate dielectric includes plasma etching the fluoropolymer passivation layer and underlying fluoropolymer gate dielectric over the drain electrode and source electrode, and plasma etching the fluoropolymer passivation layer overlying the second area of the top gate electrode.

3. The method of claim 1 wherein forming the OSC layer includes forming the OSC layer from a material selected from a group consisting of pentacene, tetraceno[2,3-b]thiophene, TIPS-pentacene, a-sexithiophene, oligothiophene-fluorine derivatives, regioregular(poly3-hexylthiophene), poly(3,3'''-didodecylquaterthiophene), and poly(2,5-bis(3-decylthiophen-2-yl)thieno[3,2-b]thiophene.

4. The method of claim 1 wherein forming the photopatternable adhesion layer includes forming the photopatternable adhesion layer from an ultraviolet (UV) cross-linkable polymer dielectric material.

5. A method for forming an epoxy-based planarization layer overlying an organic semiconductor (OSC) film, the method comprising:

forming an OSC layer;

forming a fluoropolymer passivation layer overlying the OSC layer;

forming a photopatternable adhesion layer overlying the fluoropolymer passivationlayer;

patterning the photopatternable adhesion layer;

forming a photopatternable planarization layer, comprising an epoxy-based organic resin, overlying the photopatternable adhesion layer;

patterning the photopatternable planarization layer to expose the fluoropolymer passivation layer as follows:

exposing the photopatternable planarization layer to a temperature of less than 120 degrees C.;

forming a photopatternable planarization layer hard mask in response to the temperature exposure; and, plasma etching the fluoropolymer passivation layer to expose the OSC layer.

6. The method of claim 5 wherein forming the OSC layer includes forming the OSC layer from a material selected from a group consisting of pentacene, tetraceno[2,3-b]thiophene, TIPS-pentacene, a-sexithiophene, oligothiophene-fluorine derivatives, regioregular(poly3-hexylthiophene), poly(3,3'''-didodecylquaterthiophene), and poly(2,5-bis(3-decylthiophen-2-yl)thieno[3,2-b]thiophene.

7. The method of claim 5 wherein forming the photopatternable adhesion layer includes forming the photopatternable adhesion layer from an ultraviolet (UV) cross-linkable polymer dielectric material.

8. A method for forming an epoxy-based planarization layer overlying an organic semiconductor (OSC) film, the method comprising:

forming an OSC layer;

forming a fluoropolymer passivation layer overlying the OSC layer impermeable to a first, second, and third solvent;

forming a photopatternable adhesion layer overlying the fluoropolymer passivation layer comprising the first solvent capable of reacting with the OSC layer;

patterning the photopatternable adhesion layer;

forming a photopatternable planarization layer, comprising an epoxy-based organic resin and the second solvent capable of reacting with the OSC layer, overlying the photopatternable adhesion layer;

patterning the photopatternable planarization layer to expose the fluoropolymer passivation layer;

plasma etching the fluoropolymer passivation layer to expose the OSC layer; and, wherein patterning the photopatternable adhesion layer and photopatternable passivation layer includes developing the photopatternable adhesion layer and photopatternable passivation layer with the third solvent capable of reacting with the OSC layer.

9. The method of claim 8 wherein forming the OSC layer includes forming the OSC layer from a material selected from a group consisting of pentacene, tetraceno[2,3-b]thiophene, TIPS-pentacene, a-sexithiophene, oligothiophene-fluorine derivatives, regioregular(poly3-hexylthiophene), poly(3,3'''-didodecylquaterthiophene), and poly(2,5-bis(3-decylthiophen-2-yl)thieno[3,2-b]thiophene.

10. The method of claim 8 wherein forming the photopatternable adhesion layer includes forming the photopatternable adhesion layer from an ultraviolet (UV) cross-linkable polymer dielectric material.

* * * * *